United States Patent
Yamano

(10) Patent No.: US 12,431,352 B2
(45) Date of Patent: Sep. 30, 2025

(54) METHOD OF FORMING BISMUTH-CONTAINING GALLIUM OXIDE-BASED SEMICONDUCTOR FILM ON BASE MATERIAL, BISMUTH-CONTAINING GALLIUM OXIDE-BASED SEMICONDUCTOR FILM, AND BISMUTH-CONTAINING GALLIUM OXIDE-BASED SEMICONDUCTOR COMPONENT

(71) Applicant: TOYOTA JIDOSHA KABUSHIKI KAISHA, Toyota (JP)

(72) Inventor: Hayate Yamano, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 36 days.

(21) Appl. No.: 18/383,510

(22) Filed: Oct. 25, 2023

(65) Prior Publication Data
US 2024/0055253 A1 Feb. 15, 2024

Related U.S. Application Data

(62) Division of application No. 17/551,566, filed on Dec. 15, 2021, now abandoned.

(30) Foreign Application Priority Data

Jan. 21, 2021 (JP) ................. 2021-008206

(51) Int. Cl.
*C23C 14/28* (2006.01)
*C23C 14/08* (2006.01)
*H01L 21/02* (2006.01)

(52) U.S. Cl.
CPC ........ *H01L 21/02631* (2013.01); *C23C 14/08* (2013.01); *C23C 14/28* (2013.01); *H01L 21/02565* (2013.01)

(58) Field of Classification Search
CPC ................. C23C 14/08; C23C 14/28
See application file for complete search history.

(56) References Cited

U.S. PATENT DOCUMENTS

| 2006/0150891 | A1 | 7/2006 | Ichinose et al. |
| 2022/0157598 | A1* | 5/2022 | Nagaoka ................. C23C 16/40 |
| 2022/0230880 | A1 | 7/2022 | Yamano |

FOREIGN PATENT DOCUMENTS

| JP | 2004-342857 A | 12/2004 | |
| JP | 2020-117430 A | 8/2020 | |
| WO | WO-2021044644 A1 * | 3/2021 | ....... H01L 21/02414 |

OTHER PUBLICATIONS

Orita M, et al., "Pulsed laser deposition system for producing oxide thin films at high temperature", Review of Scientific Instruments, Aug. 2001, vol. 72, No. 8, p. 3340-pp. 3343 (5 pages).

(Continued)

*Primary Examiner* — Cachet I Proctor
(74) *Attorney, Agent, or Firm* — Sughrue Mion, PLLC

(57) ABSTRACT

There is provided a method of forming a bismuth-containing gallium oxide-based semiconductor film on a base material by a pulse laser deposition method using a target containing gallium oxide and bismuth oxide. In the method, the temperature of the base material is set to 650° C. to 1,000° C., and the laser intensity is set to 1.0 J/cm² to 10.0 J/cm². The bismuth-containing gallium oxide-based semiconductor film of the present disclosure has a proportion of the number of atoms of bismuth of 0.50 at % to 10.00 at % with respect to the total of the numbers of atoms of bismuth and gallium and has a β-gallia structure. The bismuth-containing gallium oxide-based semiconductor component of the present disclosure has a base material and the bismuth-containing gallium oxide-based semiconductor film that is laminated on the base material.

7 Claims, 8 Drawing Sheets

(56) References Cited

OTHER PUBLICATIONS

Muller S, et al., "Control of the conductivity of Si-doped β-$Ga_2O_3$ thin films via growth temperature and pressure", Physica Status Solidi A, Sep. 11, 2013, vol. 211, No. 1,pp. 34-p. 39 (6 pages).
Wang B, et al., "Deep level defects in β-Ga2O3 pulsed laser deposited thin films and Czochralski-grown bulk single crystals by thermally stimulated techniques", Journal of Applied Physics, Mar. 14, 2019, vol. 125, pp. 105103-1-105103-8 (8 pages).
Restriction Requirement issued in U.S. Appl. No. 17/551,566 Dated Dec. 13, 2022.
Non-Final Office Action issued in U.S. Appl. No. 17/551,566 Dated Feb. 22, 2023.
Final Office Action issued in U.S. Appl. No. 17/551,566 Dated Aug. 2, 2023.
Fundamentals of Semiconductor physics—Insulator, emiconductor, conductor; http://www.optique-ingenieur.org/en/courses/OPI_ang_M05_C02/co/Contenu_02.html; Feb. 13, 2023 (Year: 2023).

\* cited by examiner

METHOD OF FORMING BISMUTH-CONTAINING GALLIUM OXIDE-BASED SEMICONDUCTOR FILM ON BASE MATERIAL, BISMUTH-CONTAINING GALLIUM OXIDE-BASED SEMICONDUCTOR FILM, AND BISMUTH-CONTAINING GALLIUM OXIDE-BASED SEMICONDUCTOR COMPONENT

CROSS-REFERENCE TO RELATED APPLICATION

This is a Divisional of application Ser. No. 17/551,566 filed Dec. 15, 2021, claiming priority to Japanese Patent Application No. 2021-008206 filed on Jan. 21, 2021, incorporated herein by reference in its entirety.

BACKGROUND

1. Technical Field

The present disclosure relates to a method of forming a bismuth-containing gallium oxide-based semiconductor film on a base material, a bismuth-containing gallium oxide-based semiconductor film, and a bismuth-containing gallium oxide-based semiconductor component.

2. Description of Related Art

Japanese Unexamined Patent Application Publication No. 2020-117430 (JP 2020-117430 A) discloses a method of producing gallium oxide, which includes depositing a nitrogen-doped gallium oxide on a gallium oxide substrate by using a pulse laser deposition method. The above document also discloses that the temperature of the gallium oxide substrate is set to 500° C. to 900° C. and the laser intensity is set to 0.5 J/cm² at the time of production.

SUMMARY

There is a demand for a gallium oxide-based semiconductor having a monocline-based β-gallia structure, which is the most stable structure of pure gallium oxide, and having a bandgap energy smaller than that of gallium oxide, and a producing method thereof. Such gallium oxide-based semiconductor is expected to be applied to a power semiconductor device that is used for and withstands medium and high voltage.

Bismuth oxide has a smaller bandgap energy than gallium oxide. As a result, a mixed crystal of gallium oxide and bismuth oxide is expected to have a smaller bandgap energy than gallium oxide.

Based on such a background, disclosers of the present disclosure have examined the incorporation of bismuth in a gallium oxide-based semiconductor film having a β-gallia structure in order to reduce the bandgap energy of the gallium oxide-based semiconductor film.

In this regard, it is difficult to sufficiently replace gallium sites in a crystal with bismuth by a pulse laser deposition method (PLD) that is carried out under conditions, such as those disclosed in JP 2020-117430 A, that is, the conditions in which the temperature of the gallium oxide substrate is set to 500° C. to 900° C. and the laser intensity is set to 0.5 J/cm², as a method of forming a bismuth-containing gallium oxide-based semiconductor film.

An object of the present disclosure is to provide a method of forming a bismuth-containing gallium oxide-based semiconductor film on a base material, a bismuth-containing gallium oxide-based semiconductor film, and a bismuth-containing gallium oxide-based semiconductor component containing the semiconductor film.

The disclosers of the present disclosure have found that the above object can be achieved by the following means:

First Aspect

A first aspect of the present disclosure relates to a method of forming a bismuth-containing gallium oxide-based semiconductor film on a base material by a pulse laser deposition method using a target containing gallium oxide and bismuth oxide.

In the method, a temperature of the base material is set to 650° C. to 1,000° C., and a laser intensity is set to 1.0 J/cm² to 10.0 J/cm².

Second Aspect

The method according to the first aspect is a method in which in a case where a proportion of the number of atoms of bismuth with respect to a total of the numbers of atoms of bismuth and gallium in the target is denoted by y at %, and the temperature of the base material is denoted by T° C., Expression (1) may be satisfied, $$y \geq 1/(0.52 - T/2{,}500) \quad (1)$$

Third Aspect

The method according to the second aspect is a method in which $5.00 \leq y \leq 50.00$ may be satisfied.

Fourth Aspect

The method according to the first aspect to the third aspect is a method in which the formed bismuth-containing gallium oxide-based semiconductor film may have a proportion of the number of atoms of bismuth of 0.50 at % to 10.00 at % with respect to a total of the numbers of atoms of bismuth and gallium and have a β-gallia structure.

Fifth Aspect

The method according to the first aspect to the fourth aspect is a method in which the base material may be an alumina base material or a gallium oxide base material.

Sixth Aspect

A sixth aspect of the present disclosure relates to a bismuth-containing gallium oxide-based semiconductor film. The bismuth-containing gallium oxide-based semiconductor film has a proportion of the number of atoms of bismuth of 0.50 at % to 10.00 at % with respect to a total of the numbers of atoms of bismuth and gallium and has a β-gallia structure.

Seventh Aspect

The bismuth-containing gallium oxide-based semiconductor film according to the sixth aspect may have a half width of a peak of 0.40° to 1.00°, where the peak is derived from a (−603) plane of the β-gallia structure in an X-ray diffraction 2θ-ω measurement.

Eight Aspect

The bismuth-containing gallium oxide-based semiconductor film according to the sixth aspect or the seventh aspect may have a bandgap energy of 3.8 eV or less.

Ninth Aspect

A ninth aspect of the present disclosure relates to a bismuth-containing gallium oxide-based semiconductor component. The bismuth-containing gallium oxide-based semiconductor component includes a base material and the bismuth-containing gallium oxide-based semiconductor film according to any one of the sixth aspect to the eighth aspect, which is laminated on the base material.

Tenth Aspect

The bismuth-containing gallium oxide-based semiconductor component according to the ninth aspect includes the base material which may be an alumina base material or a gallium oxide base material.

According to the present disclosure, it is possible to provide a method of forming a bismuth-containing gallium oxide-based semiconductor film on a base material, a bismuth-containing gallium oxide-based semiconductor film, and a bismuth-containing gallium oxide-based semiconductor component containing the semiconductor film.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
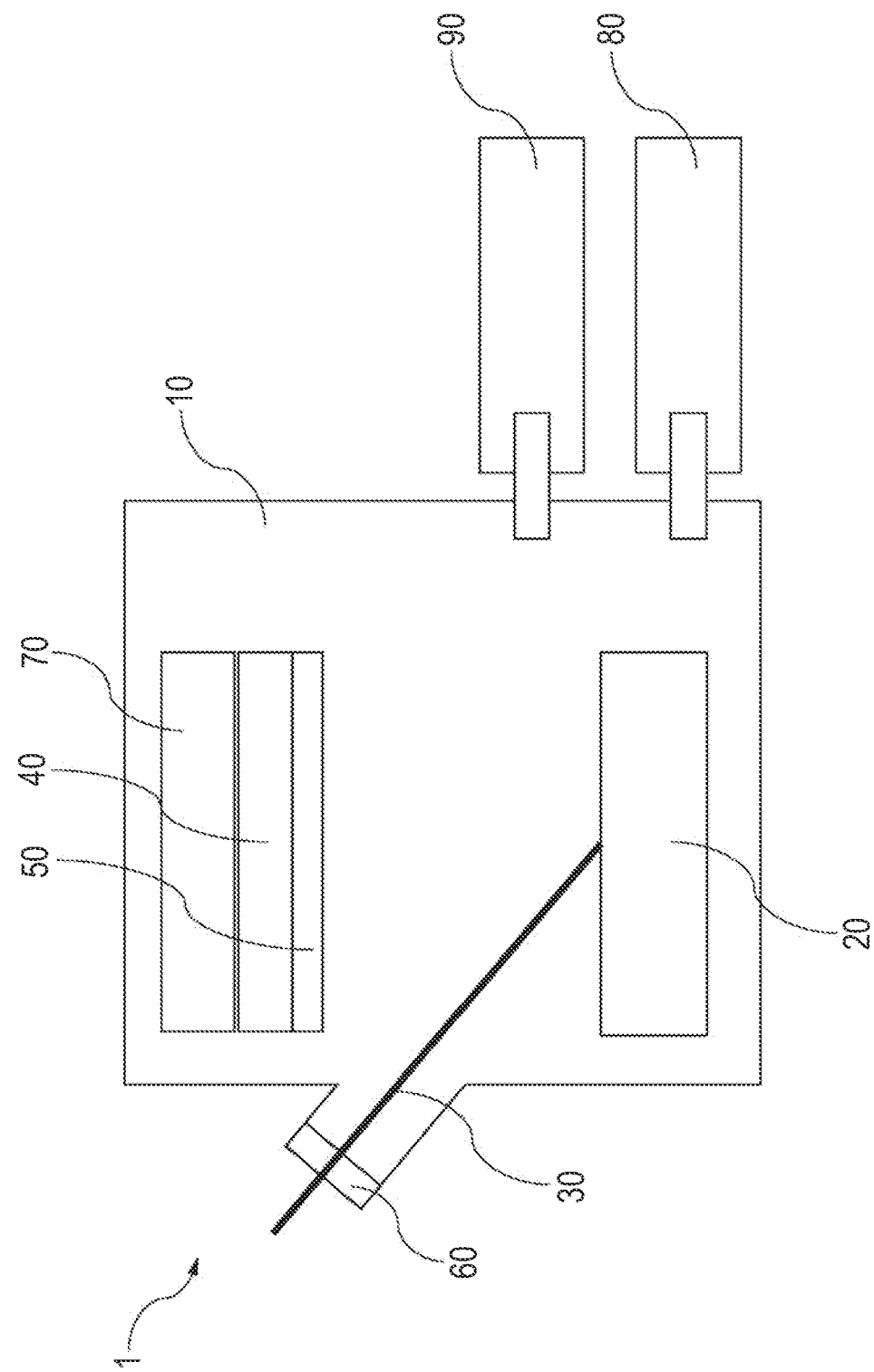
FIG. 1 is a schematic view illustrating an example of a pulse laser deposition device 1 for carrying out a method according to the first embodiment of the present disclosure.

Hereinafter, embodiments of the present disclosure will be described in detail. It is noted that the present disclosure is not limited to the following embodiments but can be variously modified and implemented within the scope of the spirit of the disclosure.

Method of Forming Bismuth-Containing Gallium Oxide-Based Semiconductor Film

The method of the present disclosure is a method of forming a bismuth-containing gallium oxide-based semiconductor film on a base material by a pulse laser deposition method using a target containing gallium oxide and bismuth oxide. In the method, the temperature of the base material is set to 650° C. to 1,000° C., and the laser intensity is set to 1.0 $J/cm^2$ to 10.0 $J/cm^2$.

Although not limited by principle, the principle, according to the method of the present disclosure by which a bismuth-containing gallium oxide-based semiconductor film can be formed on a base material, is as follows.

In the film formation method, such as a pulse laser deposition method, it is conceivable to heat a substrate to a high temperature in order to form a thin film having high crystallinity. This is because it is possible to leave solely the stable crystalline portion by heating the substrate to a high temperature while an unstable and easily eliminable amorphous portion is being eliminated.

However, it is difficult to form a bismuth-containing gallium oxide-based semiconductor film having a β-gallia structure by the pulse laser deposition method under high temperature conditions. This is presumed to be because, for example, the melting point (about 800° C.) of bismuth oxide is low and the ionic radius (1.03 Å) of bismuth is large).

More specifically, the melting point (about 800° C.) of bismuth oxide is significantly low as compared with the melting point (about 1,800° C.) of gallium oxide. As a result, in a high temperature region where a gallium oxide-based semiconductor film can be formed, bismuth is easily eliminated during the film formation. That is, in a case where the pulse laser deposition method under high temperature conditions is adopted, it is difficult to leave bismuth in the gallium oxide-based semiconductor film to be formed.

In addition, the ionic radius (1.03 Å) of bismuth is much larger than the ionic radius (0.62 Å) of gallium. For this reason, generally in a case where the pulse laser deposition method under low temperature conditions is adopted, it is difficult to maintain the β-gallia structure while bismuth is incorporated in the gallium oxide-based semiconductor film to be formed.

In this regard, in the method of the present disclosure, the laser intensity is set to 1.0 $J/cm^2$ to 10.0 $J/cm^2$ while the temperature of the substrate is maintained at a high temperature, more specifically, 650° C. to 1,000° C. in the pulse laser deposition method.

In the method of the present disclosure, the film formation rate is increased by increasing the laser intensity while the temperature of the substrate is maintained at a high temperature. In the method of the present disclosure, this makes it possible to form a thin film in which the β-gallia structure is maintained, that is, a bismuth-containing gallium oxide-based semiconductor film while the elimination of bismuth during film formation is suppressed.

The pulse laser deposition method can be carried out by, for example, a pulse laser deposition device 1 illustrated in FIG. 1. More specifically, in the method of the present disclosure, in a case where an atom (a molecule) is peeled off from a target 20 by irradiating the target 20 installed in a vacuum chamber 10 with an ablation laser light 30 from the outside of the vacuum chamber 10, a bismuth-containing gallium oxide-based semiconductor film 50 can be formed on a base material 40 facing the target 20.

The target 20 is installed on a stage in the vacuum chamber 10. The base material 40 is installed at a position separated from the target 20 by a predetermined distance in consideration of the distribution of film-forming active species scattered from the target 20. The ablation laser light 30 is obliquely incident through a quartz window 60 and is focused on the surface of the target 20 with a proper intensity. In addition, the base material 40 is heated by a base material heating mechanism 70.

In a case where the pulse laser deposition method is carried out by the device illustrated in FIG. 1, first, the target 20 is arranged in the vacuum chamber 10, and then the inside of the vacuum chamber 10 is evacuated by a vacuum exhaust mechanism 80. Then, oxygen gas as an atmospheric gas is allowed to flow from a gas introduction mechanism 90 to maintain the inside of the vacuum chamber 10 at a desired pressure. Oxygen as an atmospheric gas promotes the oxidation of the bismuth-containing gallium oxide-based semiconductor film 50 that is formed on the base material 40, thereby suppressing the elimination of bismuth.

It is noted that FIG. 1 is not intended to limit the method of the present disclosure.

Base Material

As the base material, any base material with which a gallium oxide-based semiconductor film having a β-gallia structure can be formed by the pulse laser deposition method can be adopted.

Examples of the base material include a gallium oxide base material. More specifically, as the base material, a $Ga_2O_3$ single crystal substrate produced by any method or a commercially available $Ga_2O_3$ single crystal substrate can be used. As the $Ga_2O_3$ single crystal substrate, a $β-Ga_2O_3$ single crystal substrate is particularly preferable. In addition, the base material may be an alumina base material, that is, an $Al_2O_3$ base material.

Temperature of Base Material

The film formation temperature in the method of the present disclosure, that is, the temperature of the base material in a case of carrying out the pulse laser deposition method is 650° C. to 1,000° C.

In a case where the temperature of the base material is lower than 650° C., the crystallinity of the bismuth-containing gallium oxide-based semiconductor film to be formed cannot be sufficiently obtained. On the other hand, in a case where the temperature of the base material exceeds 1,000° C., the elimination of gallium and bismuth becomes dominant, and the bismuth-containing gallium oxide-based semiconductor film cannot be sufficiently deposited on the base material.

The temperature of the base material in a case of carrying out the pulse laser deposition method may be 650° C. or higher, 750° C. or higher, 850° C. or higher, or 900° C. or higher, and may be 1,000° C. or lower, 950° C. or lower, 900° C. or lower, or 850° C. or lower.

From the viewpoint of improving the crystallinity and the bismuth content, the temperature of the base material in a case of carrying out the pulse laser deposition method is, for example, preferably 850° C. or higher and more preferably 900° C. or higher.

The temperature of the base material in a case of carrying out the method of the present disclosure can be measured by a known method. More specifically, the temperature of the base material can be obtained, for example, as a value actually measured by placing a thermocouple in a holder on which the base material 40 is arranged in a case where a device, such as the pulse laser deposition device 1 illustrated in FIG. 1 is used.

Target

The target that is used in the method of the present disclosure contains gallium oxide and bismuth oxide.

As the target, for example, a sintered body of gallium oxide particles and bismuth oxide particles can be used.

Figure 7:
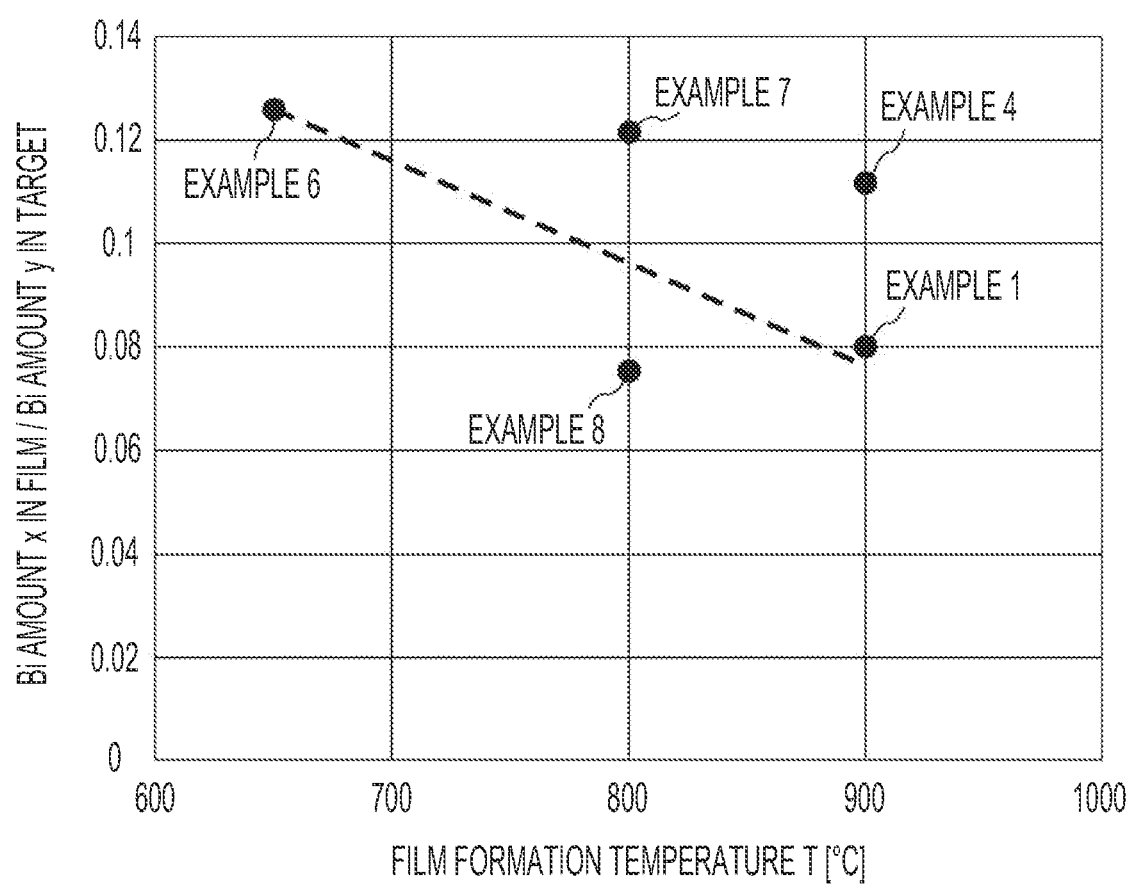
FIG. 7 is a graph showing a relationship between a ratio of a content (at %) of bismuth in a bismuth-containing gallium oxide-based semiconductor film relative to a content (at %) of bismuth in a target and a temperature (° C.) of a base material, regarding the samples of Examples 1 and 4, and Examples 6 to 8.

As shown in FIG. 7, at least under the conditions of Examples, it is conceived that in the method of the present disclosure, in a case where the proportion of the number of atoms of bismuth with respect to the total of the numbers of atoms of bismuth and gallium in the bismuth-containing gallium oxide-based semiconductor film is denoted by x at %, the proportion of the number of atoms of bismuth with respect to the total of the numbers of atoms of bismuth and gallium in the target is denoted by y at %, and the temperature of the base material is denoted by T° C., Expression (2) below tends to be satisfied:

$$0.26-T/5,000=x/y \qquad (2)$$

As a result, in a case where the proportion y at % of the number of atoms of bismuth with respect to the total of the numbers of atoms of bismuth and gallium in the target and the temperature T° C. of the base material are set so that at least Expression (2) above is satisfied, it is conceived that the proportion x at % of the number of atoms of bismuth with respect to the total of the numbers of atoms of bismuth and gallium in the bismuth-containing gallium oxide-based semiconductor film to be formed can be set in a desired range.

Here, the bismuth-containing gallium oxide-based semiconductor film that has a proportion of the number of atoms of bismuth with respect to the total of the numbers of atoms of bismuth and gallium is 0.50% or more is preferable since it has a particularly low energy bandgap.

Here, regarding Expression (2) above, in order for x at % to be 0.50 at % or more, T and y need to satisfy Expression (3) below:

$$0.26-T/5,000 \geq 0.50/y \qquad (3)$$

The expression can be rearranged as Expression (1) below:

$$y \geq 1/(0.52-T/2,500) \qquad (1)$$

Accordingly, for example, in a case where the proportion of the number of atoms of bismuth with respect to the total of the numbers of atoms of bismuth and gallium is intended to be about 0.50% or more, y at % and T° C. can be set so that Expression (1) above is made to be satisfied. In Expressions (1) to (3) above, x>0 and y>0 are satisfied. Further, T is 650° C. to 1,000° C.

The proportion of the number of atoms of bismuth with respect to the total of the numbers of atoms of bismuth and gallium in the target is preferably 5.00 at % to 50.00 at %.

The proportion of the number of atoms of bismuth with respect to the total of the numbers of atoms of bismuth and gallium in the target may be 5.00 at % or more, 10.00 at % or more, 15.00 at % or more, or 20.00 at % or more, and may be 50.00 at % or less, 45.00 at % or less, 40.00 at % or less, or 35.00 at % or less.

Laser Intensity

In the method of the present disclosure, the laser intensity is 1.0 $J/cm^2$ to 10.0 $J/cm^2$.

In a case where the laser intensity is smaller than 1.0 $J/cm^2$, the film formation rate is low, and thus bismuth is easily eliminated during film formation. Therefore, it is impossible for bismuth to be sufficiently incorporated in the gallium oxide-based semiconductor film to be formed.

On the other hand, in a case where the laser intensity is more than 10.0 J/cm², gallium oxide and bismuth oxide in the target possibly adheres to the base material, in the state of fine particles that are not sufficiently decomposed. The adhesion of such fine particles to the base material is conceived to reduce electrical characteristics, such as an increase in resistance of a gallium oxide-based semiconductor film to be formed, a decrease in withstand voltage, and an increase in leakage current.

The laser intensity may be 1.0 J/cm² or more, 2.0 J/cm² or more, 3.0 J/cm² or more, or 4.0 J/cm² or more, and may be 10.0 J/cm² or less, 9.0 J/cm² or less, 8.0 J/cm² or less, or 7.0 J/cm² or less.

The laser may be, for example, a pulsed ultraviolet laser. The ultraviolet laser may be, for example, an ArF excimer laser.

In addition, the laser intensity can be measured by a known method. More specifically regarding the laser intensity, for example, in a case where a device, such as the pulse laser deposition device 1 illustrated in FIG. 1 is used, it is possible to obtain a laser intensity actually measured by a joule meter at a position immediately before a laser passes through the quartz window 60 as a value divided by an area irradiated with the laser.

Bismuth-Containing Gallium Oxide-Based Semiconductor Film

The bismuth-containing gallium oxide-based semiconductor film of the present disclosure can be formed by, for example, the method described above. The bismuth-containing gallium oxide-based semiconductor film of the present disclosure may be arranged on the base material described in the method of the present disclosure.

The bismuth-containing gallium oxide-based semiconductor film of the present disclosure has a proportion of the number of atoms of bismuth of 0.50 at % to 10.00 at % with respect to the total of the numbers of atoms of bismuth and gallium and has a β-gallia structure.

The semiconductor film usable for a power semiconductor device that is used for and withstands medium and high voltage is desirably a semiconductor film having a bandgap energy lower about 1.0 eV to 2.0 eV than that of the gallium oxide-based semiconductor film to which a heteroelement is not added is.

In this regard, considering the difference in bandgap energy between gallium oxide (bandgap energy: about 4.8 eV) and bismuth oxide (bandgap energy: about 2.8 eV), it is conceived for reducing the bandgap energy of about 1.0 eV to 2.0 eV, the proportion of the number of atoms of bismuth with respect to the total of the numbers of atoms of bismuth and gallium needs to be 50.00 at % or more in the bismuth-containing gallium oxide-based semiconductor film.

However, in a case where the proportion of the number of atoms of bismuth with respect to the total of the numbers of atoms of bismuth and gallium is 50.00 at % or more, the crystallinity is reduced. That is, it is difficult to maintain the β-gallia structure of the bismuth-containing gallium oxide-based semiconductor film.

In a case where the crystallinity of the bismuth-containing gallium oxide-based semiconductor film is too low, the electrical characteristics of the bismuth-containing gallium oxide-based semiconductor film, such as an increase in resistance, decrease in withstand voltage, and increase in leakage current can be reduced.

In this regard, since the bismuth-containing gallium oxide-based semiconductor film of the present disclosure has a proportion of the number of atoms of bismuth of 0.50 at % to 10.00 at % with respect to the total of the numbers of atoms of bismuth and gallium, the β-gallia structure of the bismuth-containing gallium oxide-based semiconductor film is maintained.

Furthermore, although the proportion of the number of atoms of bismuth with respect to the total of the numbers of atoms of bismuth and gallium is much smaller than 50.00 at %, the bandgap energy is low about 1.0 eV to 2.0 eV as compared with that of the gallium oxide-based semiconductors to which a heteroelement is not added. This is conceived to be a specific effect due to the bonding of bismuth to oxygen although the principle thereof is not clear.

As described above, the bismuth-containing gallium oxide-based semiconductor film of the present disclosure has a low bandgap energy while the β-gallia structure is maintained due to the low bismuth content.

In a case where the proportion of the number of atoms of bismuth with respect to the total of the numbers of atoms of bismuth and gallium is less than 0.50 at %, the bandgap energy cannot be sufficiently reduced. On the other hand, in a case where the proportion of the number of atoms of bismuth with respect to the total of the numbers of atoms of bismuth and gallium is more than 10.00 at %, the high crystallinity of the bismuth-containing gallium oxide-based semiconductor film is not maintained. That is, the β-gallia structure is not maintained.

The proportion of the number of atoms of bismuth with respect to the total of the numbers of atoms of bismuth and gallium may be 0.50 at % or more, 0.70 at % or more, 1.00 at % or more, or 1.50 at % or more, and may be 10.00 at % or less, 5.00 at % or less, 4.50 at % or less, or 3.50 at % or less.

The proportion of the number of atoms of bismuth with respect to the total of the numbers of atoms of bismuth and gallium is particularly preferably 0.70 at % or more. This is because a particularly small bandgap energy can be achieved in a case where the proportion of the number of atoms of bismuth is such a value.

The bismuth-containing gallium oxide-based semiconductor film of the present disclosure has a β-gallia structure. Here, the description that the bismuth-containing gallium oxide-based semiconductor film "has a β-gallia structure" means that it has a structure in which a periodic structure similar to the crystal structure included in the β-type $Ga_2O_3$ is maintained and which does not need to completely match the crystal structure of β-type $Ga_2O_3$. For example, the description that the bismuth-containing gallium oxide-based semiconductor film "has a β-gallia structure" means that the structure may be a structure in which part of the gallium sites in the crystal structure included in the β-type $Ga_2O_3$ are replaced with bismuth.

The half width of the peak derived from the (−603) plane of the β-gallia structure in the X-ray diffraction 2θ-ω measurement may be 0.40° to 1.00°.

The half width of the peak is an index indicating the degree of crystallinity, and it is generally conceived that the smaller the half width of the peak is, the higher the crystallinity is. In a case where the half width of the peak derived from the β-gallia structure is 1.00° or less, it can be said that the gallium oxide-based semiconductor film has sufficiently high crystallinity.

The half width of the peak derived from the β-gallia structure may be 0.40° or more, 0.45° or more, 0.50° or more, or 0.55° or more, and may be 1.00° or less, 0.95° or less, 0.90° or less, or 0.85° or less.

The film thickness of the bismuth-containing gallium oxide-based semiconductor film of the present disclosure is not particularly limited; however, it may be 30 nm to 300 nm.

The film thickness of the bismuth-containing gallium oxide-based semiconductor film of the present disclosure may be 30 nm or more, 50 nm or more, 80 nm or more, or 100 nm or more, and may be 300 nm or less, 250 nm or less, 200 nm or less, or 150 nm or less.

The bandgap energy of the bismuth-containing gallium oxide-based semiconductor film of the present disclosure may be 3.8 eV or less.

Generally, the bandgap energy of the gallium oxide-based semiconductor film to which a heteroelement is not added is conceived to be about 4.8 eV. It can be said that the bandgap energy of 3.8 eV or less is sufficiently small in the gallium oxide-based semiconductor film usable for a power semiconductor device that is used for and withstands medium and high voltage.

The bandgap energy of the bismuth-containing gallium oxide-based semiconductor film of the present disclosure may be 3.8 eV or less, 3.6 eV or less, 3.4 eV or less, or 3.2 eV or less, and may be 2.8 eV or more, 2.9 eV or more, 3.0 eV or more, or 3.1 eV or more.

Bismuth-Containing Gallium Oxide-Based Semiconductor Component

The bismuth-containing gallium oxide-based semiconductor component of the present disclosure has a base material and a bismuth-containing gallium oxide-based semiconductor film of the present disclosure, which is laminated on the base material. As the base material, those described in the method of the present disclosure can be adopted.

The bismuth-containing gallium oxide-based semiconductor component of the present disclosure can be used, for example, in a power semiconductor. More specifically, it can be used for rectification, frequency conversion, a regulator, or an inverter.

EXAMPLES 1 TO 5 AND COMPARATIVE EXAMPLES 1 AND 2

Example 1

A gallium oxide-based semiconductor film was formed on a base material using a pulse laser deposition device. Specifically, a gallium oxide-based semiconductor film was formed as follows.

A base material and a target were placed in a vacuum chamber and evacuation was carried out. Next, oxygen gas as an atmospheric gas was allowed to flow into the vacuum chamber at a flow rate of 1.0 sccm to adjust the inside of the vacuum chamber to 2.0 Pa. Next, the base material was heated to 900° C. by the base material heating mechanism. The target was irradiated with ablation laser light to form a gallium oxide-based semiconductor film on the base material.

Here, the target was prepared by mixing a gallium oxide powder with a bismuth oxide powder and subjecting them to powder compacting and sintering. In the target, the proportion of the number of atoms of bismuth with respect to the total of the numbers of atoms of bismuth and gallium was 25.00 at %.

As the base material, an $\alpha Al_2O_3$ (0001) plane substrate was used.

Further, as the ablation laser light, an ArF excimer laser which is an ultraviolet ray was used. The laser intensity was 1.0 J/cm$^2$.

The conditions of the method of Example 1 are summarized in Table 1.

Example 2

A gallium oxide-based semiconductor film was formed in the same manner as in Example 1 except that the heating temperature of the base material was set to 650° C.

The conditions of the method of Example 2 are summarized in Table 1.

Example 3

A gallium oxide-based semiconductor film was formed in the same manner as in Example 1 except that the amount of bismuth with respect to the total of bismuth and gallium in the target was set to 6.25 at %.

The conditions of the method of Example 3 are summarized in Table 1.

Example 4

A gallium oxide-based semiconductor film was formed in the same manner as in Example 1 except that the amount of bismuth with respect to the total of bismuth and gallium in the target was set to 12.50 at %.

The conditions of the method of Example 4 are summarized in Table 1.

Example 5

A gallium oxide-based semiconductor film was formed in the same manner as in Example 1 except that the amount of bismuth with respect to the total of bismuth and gallium in the target was set to 50.00 at %.

The conditions of the method of Example 5 are summarized in Table 1.

Comparative Example 1

A gallium oxide-based semiconductor film was formed in the same manner as in Example 1 except that the laser intensity was set to 0.5 J/cm$^2$.

The conditions of the method of Comparative Example 1 are summarized in Table 1.

Comparative Example 2

A gallium oxide-based semiconductor film was formed in the same manner as in Example 2 except that the laser intensity was set to 0.5 J/cm$^2$.

The conditions of the method of Comparative Example 2 are summarized in Table 1.

X-ray Photoelectron Spectroscopic Measurement

An X-ray photoelectron spectroscopic measurement was carried out on the gallium oxide-based semiconductor film obtained by the method of each Example. From the measurement results, the proportion (at %) of the number of atoms of bismuth with respect to the total of the numbers of atoms of bismuth and gallium in the gallium oxide-based semiconductor film was calculated.

The measurement results are summarized in Table 1.

Measurement of Light Transmittance

The light transmittance of the gallium oxide-based semiconductor film obtained by the method of Example was measured. Based on the measurement results, the amount of decrease in the bandgap energy of the gallium oxide-based semiconductor film containing no heteroelement was calculated.

The calculation results are summarized in Table 1.

Here, the bandgap energy of the pure gallium oxide-based semiconductor film to which no heteroelement is added is 4.8 eV.

X-ray Diffraction 2θ-ω Measurement

An X-ray diffraction 2θ-ω measurement was carried out on the gallium oxide-based semiconductor film obtained by the method of each Example. From the measurement results, the half width of the peak derived from the (−603) plane of the β-gallia structure was determined.

The measurement results are summarized in Table 1.

Result

The conditions of the methods of Examples 1 to 5 and Comparative Examples 1 and 2 and the measurement results of the performance of the gallium oxide-based semiconductor film obtained by these methods are shown in Table 1 and FIGS. 2 to 7.

In Table 1, "Bi content (at %) in target" means the proportion (at %) of the number of atoms of bismuth with respect to the total of the numbers of atoms of bismuth and gallium in the target. In Table 1, "Bi content (at %) in $Ga_2O_3$-based semiconductor film" means the proportion (at %) of the number of atoms of bismuth with respect to the total of the numbers of atoms of bismuth and gallium in the gallium oxide-based semiconductor film. Here, in Examples in which bismuth cannot be detected since the lower detection limit of "Bi content (at %) in $Ga_2O_3$-based semiconductor film" is 0.5 at %, the Bi content is described as "<0.5".

Figure 2:
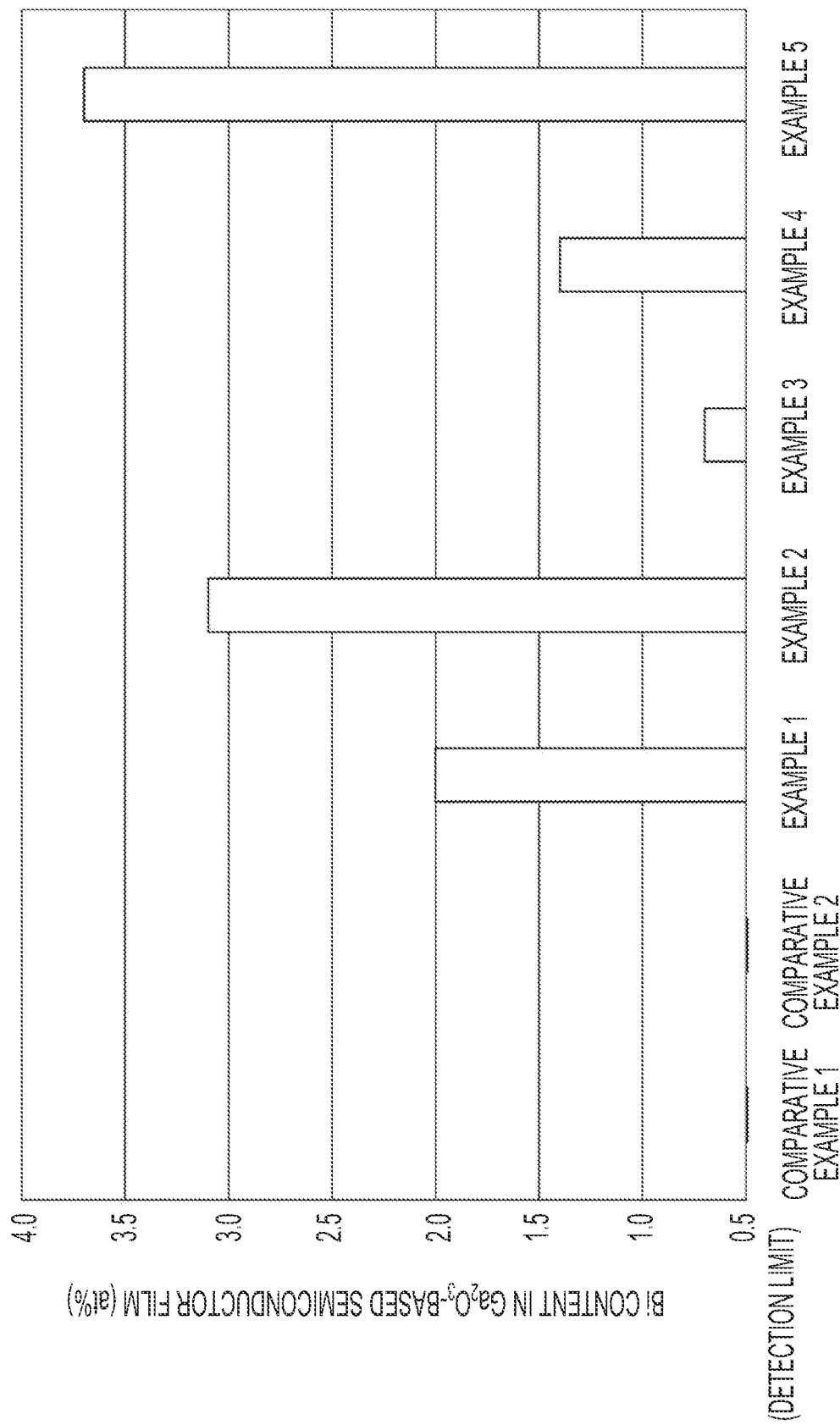
FIG. 2 is a graph in which a proportion (at %) of the number of atoms of bismuth with respect to the total of the numbers of atoms of bismuth and gallium is compared between samples of Examples 1 to 5 and Comparative Examples 1 and 2.

As shown in Table 1 and FIG. 2, in Examples 1 to 5 in which the heating temperature of the base material was 650° C. or 900° C. and the laser intensity was 1.0 J/cm², the proportions of the number of atoms of bismuth with respect to the total of the numbers of atoms of bismuth and gallium in the gallium oxide-based semiconductor films were respectively 2.00 at %, 3.10 at %, 0.70 at %, 1.40 at %, and 3.70 at % in order. On the other hand, in both Comparative Examples 1 and 2 in which the heating temperature of the base material was 650° C. or 900° C. and the laser intensity was 0.5 J/cm², the proportion of the number of atoms of bismuth with respect to the total of the numbers of atoms of bismuth and gallium in the gallium oxide-based semiconductor film was smaller than 0.50 at % which is the lower detection limit.

Figure 3:
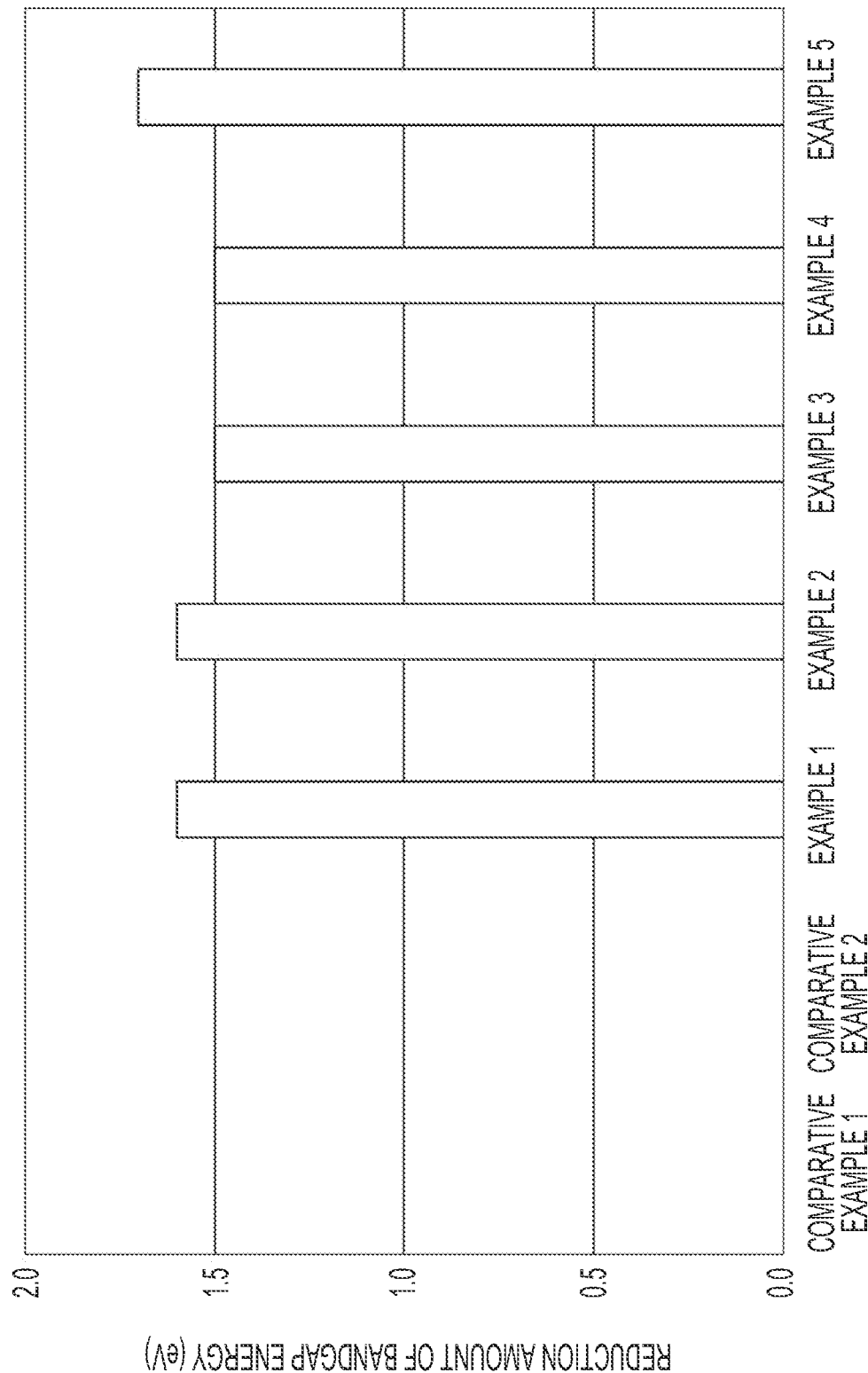
FIG. 3 is a graph in which a reduction amount of bandgap energy from the bandgap energy of a gallium oxide-based semiconductor film containing no heteroelements is compared between the samples of Examples 1 to 5 and Comparative Examples 1 and 2.

In addition, as shown in Table 1 and FIG. 3, in Examples 1 to 5, the amounts of decrease in the bandgap energy of the gallium oxide-based semiconductor films were respectively 1.6 eV, 1.6 eV, 1.5 eV, 1.5 eV, and 1.7 eV in order. In other words, in these Examples, the bandgap energies of the gallium oxide-based semiconductor films were respectively 3.2 eV, 3.2 eV, 3.3 eV, 3.3 eV, and 3.1 eV in order.

These results mean that the effect of reducing the bandgap energy was sufficiently obtained in Examples 1 to 5.

On the other hand, in Comparative Examples 1 and 2, the amount of decrease in the bandgap energy was 0.0 eV. In other words, in these Examples, the bandgap energy of the gallium oxide-based semiconductor film was 4.8 eV.

In the gallium oxide-based semiconductor films formed by the methods of Comparative Examples 1 and 2, the fact that the bandgap energy of the gallium oxide-based semiconductor film is 4.8 eV means that the effect of reducing the bandgap energy is not obtained.

Figure 4:
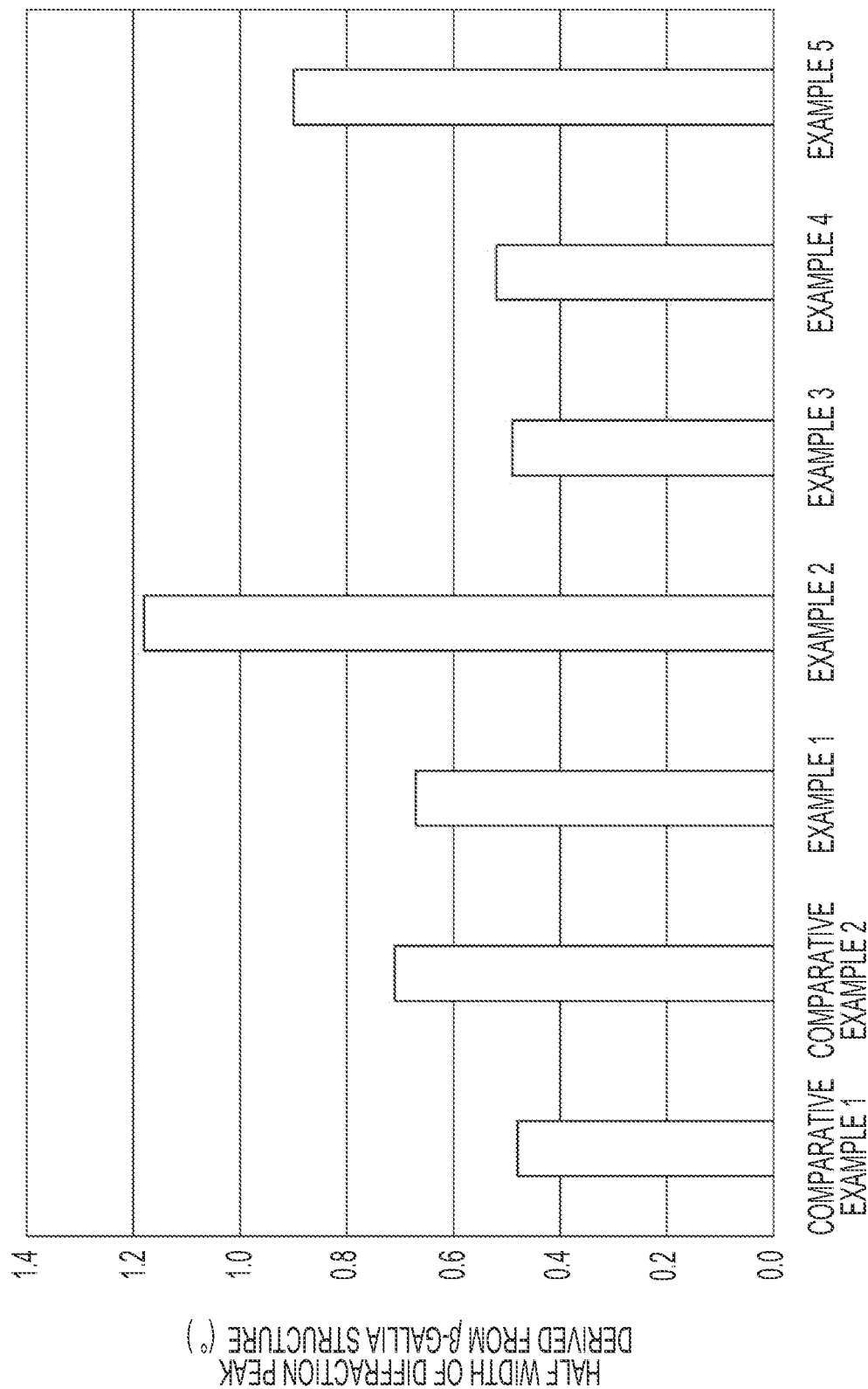
FIG. 4 is a graph in which a half width of a diffraction peak derived from a β-gallia structure is compared between the samples of Examples 1 to 5 and Comparative Examples 1 and 2.
Figure 5:
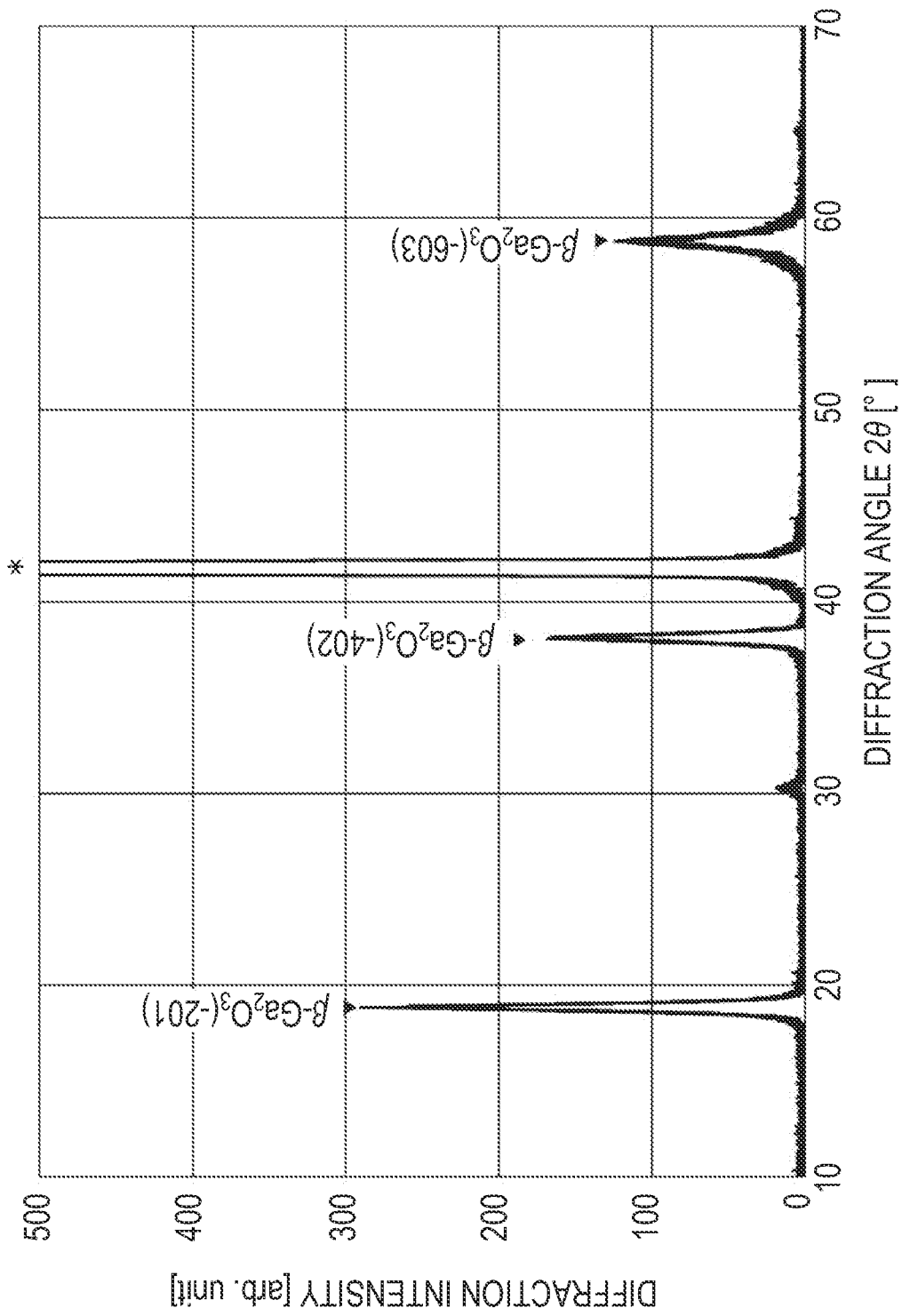
FIG. 5 is a graph showing results of an X-ray diffraction 2θ-ω measurement of the sample of Example 1.
Figure 6:
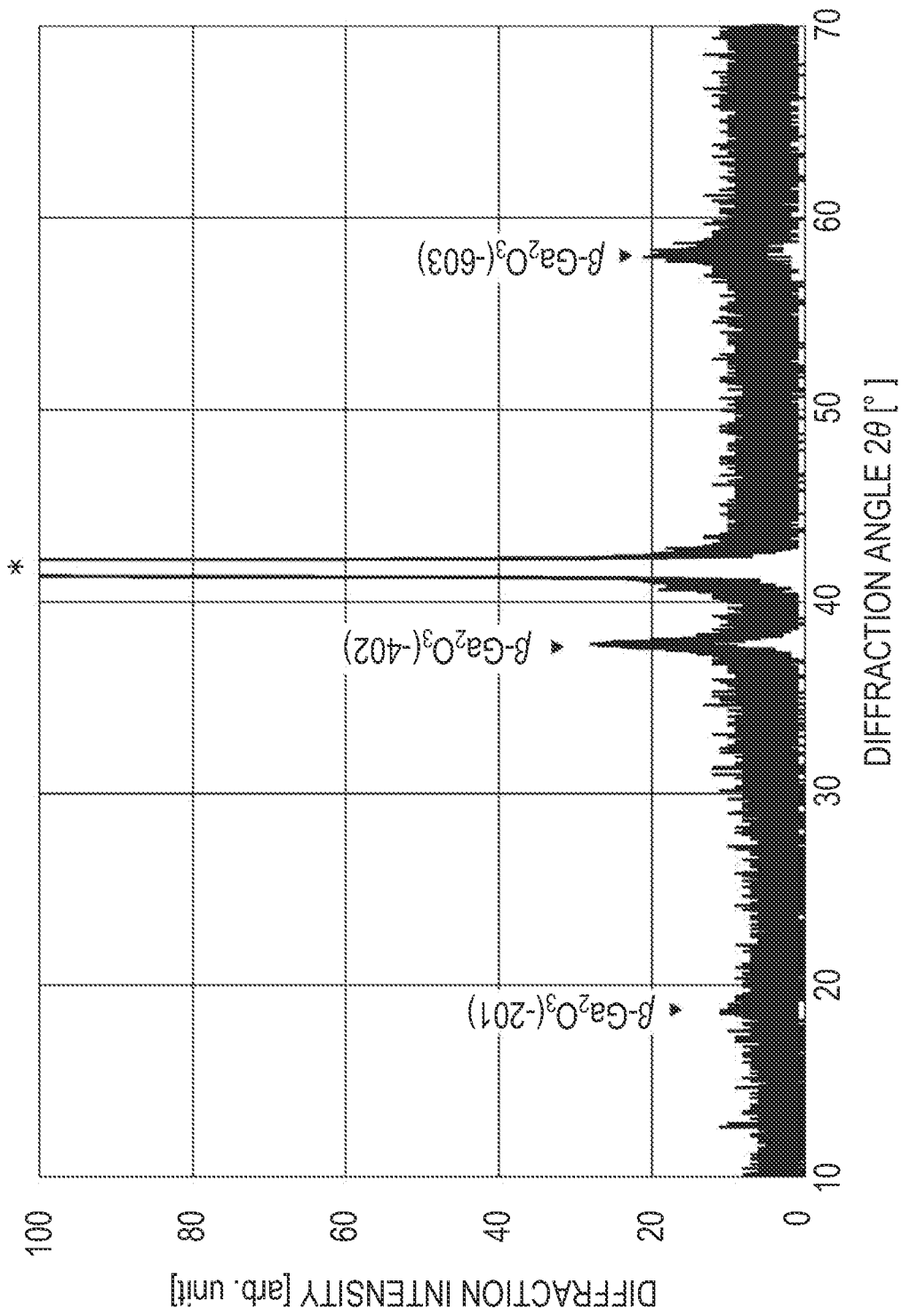
FIG. 6 is a graph showing results of an X-ray diffraction 2θ-ω measurement of the sample of Example 2.

Further, as shown in Table 1 and FIGS. 4 to 6, the half widths of the peak derived from the (−603) plane of the β-gallia structure of the gallium oxide-based semiconductor films in Examples 1 to 5 were respectively 0.67°, 1.18°, 0.49°, 0.52°, and 0.90° in order. These results mean that the β-gallia structure of the gallium oxide-based semiconductor film was maintained in each Example. It can be said that

TABLE 1

| | | Comparative Example 1 | Comparative Example 2 | Example 1 | Example 2 | Example 3 | Example 4 | Example 5 |
|---|---|---|---|---|---|---|---|---|
| Conditions | Base material temperature (° C.) | 900 | 650 | 900 | 650 | 900 | 900 | 900 |
| | Laser intensity (J/cm²) | 0.5 | 0.5 | 1.0 | 1.0 | 1.0 | 1.0 | 1.0 |
| | Bi content in target (at %) | 25.00 | 25.00 | 25.00 | 25.00 | 6.25 | 12.50 | 50.00 |
| Results | Bi content in $Ga_2O_3$-based semiconductor film (at %) | <0.50 | <0.50 | 2.00 | 3.10 | 0.70 | 1.40 | 3.70 |
| | Amount of decrease in bandgap energy (eV) | 0.0 | 0.0 | 1.6 | 1.6 | 1.5 | 1.5 | 1.7 |
| | Half width of peak derived from β-gallia structure (°) | 0.48 | 0.71 | 0.67 | 1.18 | 0.49 | 0.52 | 0.90 | very high crystallinity was maintained, among the above, in Example 1 and Examples 3 to 5, particularly in Example 3.

In Comparative Examples 1 and 2, the half widths of the peak derived from the (−603) plane of the β-gallia structure of the gallium oxide-based semiconductor films were respectively 0.48° and 0.71° in order. In Comparative Examples 1 and 2, it is conceived that high crystallinity was maintained since the gallium oxide-based semiconductor film contained almost no bismuth.

Figure 8:
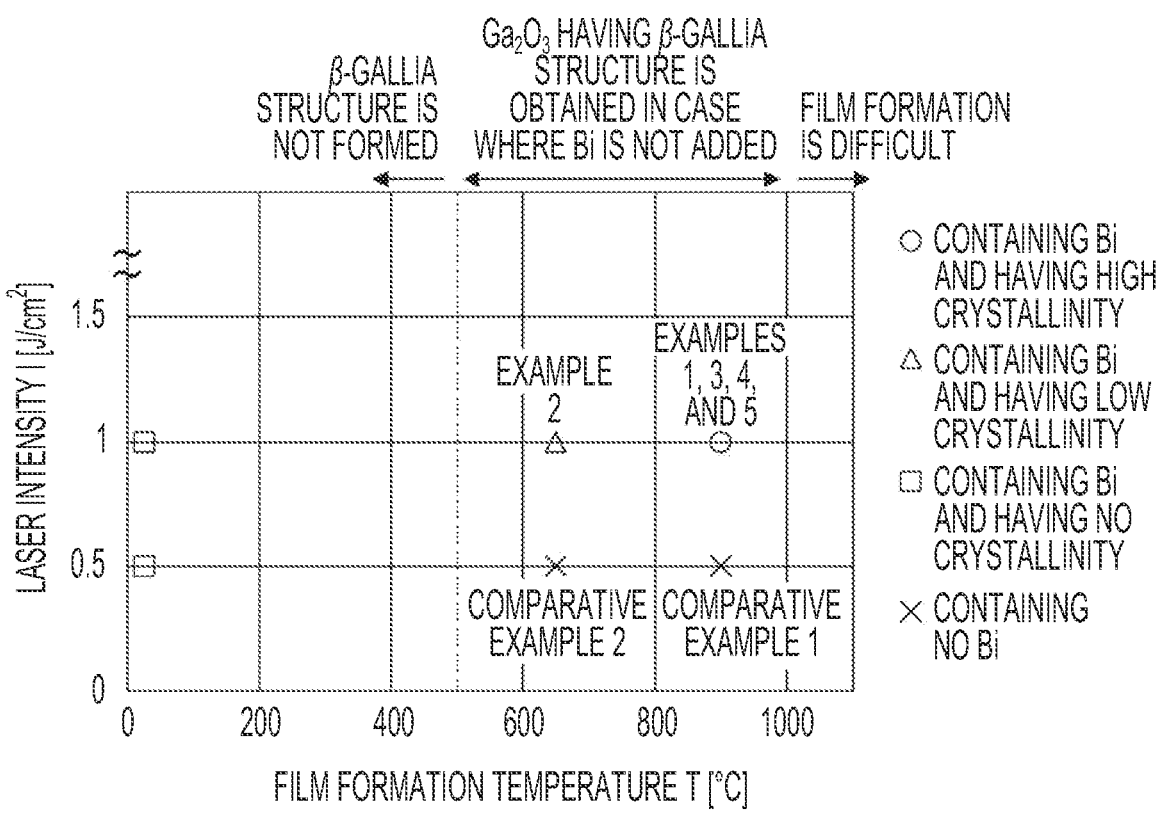
FIG. 8 is a graph in which film formation conditions and results regarding the samples of Examples 1 to 5 and Comparative Examples 1 and 2 are summarized.

FIG. 8 is a graph in which film formation conditions and results regarding the samples of Examples 1 to 5 and Comparative Examples 1 and 2 are summarized.

As shown in FIG. 8, conditions in which the temperature of the base material is set to 650° C. to 1,000° C. and the laser intensity is set to 1.0 J/cm² to 10.0 J/cm² are derived as the conditions for forming a bismuth-containing gallium oxide-based semiconductor film having high crystallinity by a pulse laser deposition method using a target containing gallium oxide and bismuth oxide.

Example 1, Example 4, and Examples 6 to 8

Gallium oxide-based semiconductor films of Examples 6 to 8 were formed in the same manner as in Example 1 except that the temperature of the base material and the amount of bismuth with respect to the total of bismuth and gallium in the target were set as shown in Table 2 below.

X-ray Photoelectron Spectroscopic Measurement

By the same method as the above-described X-ray photoelectron spectroscopic measurement, the proportion (at %) of the number of atoms of bismuth with respect to the total of the numbers of atoms of bismuth and gallium in the gallium oxide-based semiconductor film of each of Examples 1, 4, and Examples 6 to 8 was calculated. In addition, the ratio of the proportion (at %) of the number of atoms of bismuth with respect to the total of the numbers of atoms of bismuth and gallium in the gallium oxide-based semiconductor film relative to the proportion (at %) of bismuth with respect to the total of bismuth and gallium in the target was calculated.

Result

Table 2 and FIG. 7 show the conditions of the methods of Example 1, Example 4, and Examples 6 to 8 and the calculation results regarding the amounts of bismuth in the gallium oxide-based semiconductor films obtained by these methods.

TABLE 2

|  |  | Example 6 | Example 7 | Example 8 | Example 4 | Example 1 |
|---|---|---|---|---|---|---|
| Conditions | Base material temperature (° C.) | 650 | 800 | 800 | 900 | 900 |
|  | Laser intensity (J/cm²) | 1.0 | 1.0 | 1.0 | 1.0 | 1.0 |
|  | Bi content in target (at %) | 25.00 | 25.00 | 50.00 | 12.50 | 25.00 |
| Results | Bi content in Ga₂O₃-based semiconductor film (at %) | 3.10 | 3.10 | 3.70 | 1.40 | 2.00 |
|  | Bi content in Ga₂O₃-based semiconductor film/Bi content in target | 0.124 | 0.124 | 0.074 | 0.112 | 0.08 |

As shown in FIG. 7, from Examples 1, 4, and Examples 6 to 8, under the condition in which the laser intensity is 1.0 J/cm², it can be said that in a case where the proportion of the number of atoms of bismuth with respect to the total of the numbers of atoms of bismuth and gallium in the gallium oxide-based semiconductor film is denoted by x at %, the proportion of the number of atoms of bismuth with respect to the total of the numbers of atoms of bismuth and gallium in the target is denoted by y at %, and the temperature of the base material is denoted by T° C., Expression (2) below tends to be satisfied:

$$0.26 - T/5{,}000 = x/y \qquad (2)$$

Here, regarding Expression (2) above, in order for x at % to be 0.50 at % or more, T and y need to satisfy Expression (3) below:

$$0.26 - T/5{,}000 \geq 0.50/y \qquad (3)$$

The expression can be rearranged as Expression (1) below:

$$y \geq 1/(0.52 - T/2{,}500) \qquad (1)$$

What is claimed is:

1. A method of forming a bismuth-containing gallium oxide-based semiconductor film on a base material, comprising:
   placing a base material and a target in a vacuum chamber, the target being a sintered body of gallium oxide and bismuth oxide;
   heating the base material at a temperature from 650° C. to 1,000° C.; and
   irradiating the target with a pulse laser such that a bismuth-containing gallium oxide-based semiconductor film is formed on the base material, a laser intensity of the pulse laser being greater than 0.5 J/cm² and equal to less than 10.0 J/cm², base
   wherein in a case where a proportion of the number of atoms of bismuth with respect to a total number of atoms of bismuth and gallium in the target is denoted by y at %, and the temperature of the base material is denoted by T° C., Expression (1) is satisfied, $$y \geq 1/(0.52 - T/2{,}500) \qquad (1).$$

2. The method according to claim 1, wherein 5.00≤y≤ 50.00 is satisfied.

3. The method according to claim 1, wherein the formed bismuth-containing gallium oxide-based semiconductor film has a proportion of the number of atoms of bismuth of 0.50 at % to 10.00 at % with respect to a total numbers of atoms of bismuth and gallium and has a β-gallia structure.

4. The method according to claim 1, wherein the base material is an alumina base material or a gallium oxide base material.

5. The method according to claim 1, wherein the base material is heated at a temperature from 850° C. to 1,000° C.

6. The method according to claim 1, wherein the laser intensity is equal to or greater than 1.0 J/cm$^2$ and equal to or less than 10.0 J/cm$^2$.

7. The method according to claim 1, wherein the laser intensity is greater than 0.5 J/cm$^2$ and equal to less than 1.5 J/cm$^2$.

* * * * *